(12) United States Patent
Ramm et al.

(10) Patent No.: US 9,905,399 B2
(45) Date of Patent: Feb. 27, 2018

(54) CARBON SPARK EVAPORATION

(75) Inventors: Jürgen Ramm, Maienfeld (CH); Beno Widrig, Bad Ragaz (CH); Kurt Ruhm, Schaanwald (LI)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 43 days.

(21) Appl. No.: 14/110,982

(22) PCT Filed: Mar. 26, 2012

(86) PCT No.: PCT/EP2012/001322
§ 371 (c)(1),
(2), (4) Date: Nov. 12, 2013

(87) PCT Pub. No.: WO2012/139707
PCT Pub. Date: Oct. 18, 2012

(65) Prior Publication Data
US 2014/0054165 A1 Feb. 27, 2014

(30) Foreign Application Priority Data

Apr. 11, 2011 (DE) .................. 10 2011 016 681

(51) Int. Cl.
*C23C 14/00* (2006.01)
*C23C 14/32* (2006.01)
(Continued)

(52) U.S. Cl.
CPC ...... *H01J 37/32055* (2013.01); *C23C 14/325* (2013.01); *H01J 37/32064* (2013.01);
(Continued)

(58) Field of Classification Search
CPC .................................................. C23C 14/325
See application file for complete search history.

(56) References Cited

U.S. PATENT DOCUMENTS

| 4,645,895 A | 2/1987 | Boxman |
| 2008/0210545 A1* | 9/2008 | Kouznetsov ........ H01J 37/3405 |
| | | 204/192.12 |
| 2008/0286496 A1* | 11/2008 | Ramm et al. ................. 427/580 |

FOREIGN PATENT DOCUMENTS

| DE | 44 01 986 A1 | 7/1995 |
| EP | 0 666 335 B1 | 8/1995 |

(Continued)

OTHER PUBLICATIONS

International Search Report for PCT/EP2012/001322, dated Sep. 26, 2012.
(Continued)

*Primary Examiner* — Ibrahime A Abraham
(74) *Attorney, Agent, or Firm* — Pearne & Gordon LLP

(57) ABSTRACT

The invention relates to a method for operating a pulsed discontinuous spark discharge. The spark is fed via a capacitor. Between the pulses there are switched-off time intervals during which no spark current flows. Within the pulses, that is to say during the switched-on time intervals, the supply of charge is stopped upon a current threshold being reached and is restarted, with the result that subpulses occur within the pulses. The time intervals and subpulses are chosen according to the invention such that when the capacitor is switched on again, the spark discharge readily ignites again.

10 Claims, 5 Drawing Sheets

Figure 1:
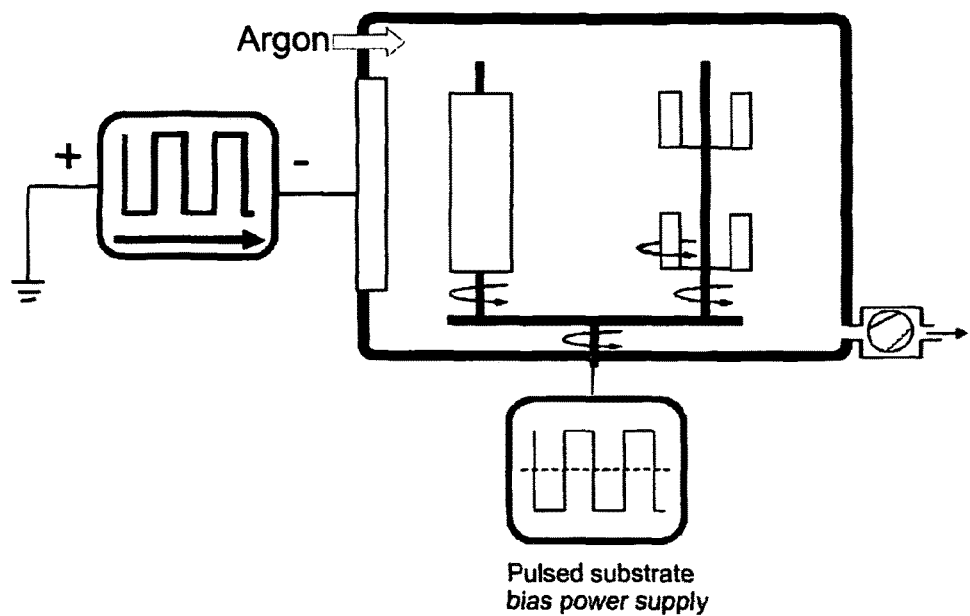

(51) Int. Cl.
*H01J 37/32* (2006.01)
*H05B 7/148* (2006.01)
*H05B 7/20* (2006.01)
*H05H 1/46* (2006.01)

(52) U.S. Cl.
CPC ............... *H05B 7/148* (2013.01); *H05B 7/20* (2013.01); *H05H 2001/4682* (2013.01)

(56) References Cited

FOREIGN PATENT DOCUMENTS

WO 2006/099758 A2 9/2006
WO 2009/059807 A1 5/2009

OTHER PUBLICATIONS

Anders et. al., "'Triggerless' triggering of vacuum", Journal of Physics D. Applied Physics, vol. 31, No. 5, Mar. 7, 1998, pp. 584-587.

\* cited by examiner

Pulsed substrate
bias power supply

Pulsed substrate
bias power supply

CARBON SPARK EVAPORATION

The invention relates to a method for the cathodic spark evaporation of carbon targets or targets with a high carbon content for the production of carbon layers or layers that contain a high proportion of carbon.

In particular, the invention relates to the production of hard carbon layers that exhibit no or only a small hydrogen content and whose hardness can be varied over a wide range.

According to the invention, a device is proposed that enables the spark to be ignited at low voltages electrically, i.e. without mechanical ignition contact, and with the possibility of a correspondingly high repetition frequency.

This device further enables the spark to be directed safely on a carbon target even of smaller surface and with a small or no magnetic field enhancement, in order to guarantee a reproducible coating under vacuum.

In a further aspect, according to the invention a device and a method are described that enable the proportion of the multi-charged carbon ions to be controlled during coating and the coating rate to be modified.

The advantageous combination of method and device is used to strongly inhibit resp. to prevent splatters that are generated during spark evaporation from being integrated in the deposited layer.

Finally, the invention relates to a hydrogen-free carbon layer produced with this method by using the disclosed device and whose hardness and surface roughness can be varied to a large extent and with which the tribological system consisting of coated body and the respective counter-body can be specifically optimized.

An important execution of the layer consists in doping with other elements, in particular with metals and gases, without however larger quantities of hydrogen being integrated.

Cathodic spark evaporation of carbon is a method that has been known for many years and that is used for coating tools and components. In this method, the targets consist of the carbon to be evaporated and are operated as cathode in a spark discharge.

Performing cathodic spark evaporation of carbon using pulsed spark current is known in the state of the art. An operation with direct current results in a "seizing-up" of the spark in one spot of the target. This is probably caused by the fact that graphite, by contrast with the usual metallic conductors, has a low specific resistance for higher temperatures and therefore the spark operation at a lower voltage is attracted to an already hot spot of the target. The pulsing of the spark current deflects the spark and prevents it from lingering on one spot and thus the burning into the target.

There are in principle two ways for generating a pulsed spark current. The first way (hereinafter called method A) consists in superimposing additional current pulses $I_{KP}$ over a continuous spark current $I_{KD}$. This is represented diagrammatically in FIG. 1. The other way (hereinafter called method B, FIG. 2) consists in simply using sequences of current pulses $I_{KP}$ for the spark current, wherein the current is switched off every time between the current pulses and therefore for each pulse the spark needs to be ignited again, which means working with a discontinuous spark current.

Both methods have advantages and disadvantages. Method A, which has been described in the document EP00666335 by Grimm, has the advantage that only one ignition operation is required for igniting the continuous spark current $I_{KD}$. The current pulses $I_{KP}$ are overlaid over this continuous spark current and therefore require no ignition of their own, which is particularly advantageous if the current pulses have high frequencies. Thus, since the continuous spark current needs to be ignited only at the beginning of the coating process, it is possible to work with a robust ignition that is common in production, via a momentary low-ohmic mechanical contact between cathode and anode. The superimposing of the continuous current $I_{KD}$, which is powered from the direct current supply, with the pulse current $I_{KP}$ can be achieved by means of a capacitor discharge connected in parallel or by means of a unipolar voltage supply connected in parallel. It is also possible to use the commercially available pulsed current supplies (e.g. those that have been developed for pulse welding) that enable the pulse parameters (frequency, pulse height, pulse width, pulse gradient) to be adjusted within a certain range.

Accordingly, document WO2009/059807 by Ramm et al. describes the pulse method among others for producing ta-C layers. In this case, a DC voltage, leading to a base current, is overlaid with voltage pulses that influence the electron emission behavior in such a manner as to prevent the "freezing up" of the spark's lowest point, i.e. the longer lingering of the spark's lowest point on a very small area of the target surface. The DC power supply is achieved with the base current in such a manner that the plasma discharge is maintained without interruption.

The necessity of a continuous current flow in method A however has two disadvantages if this method is used for producing hard carbon layers. The first lies in the danger of depositing the layer at excessively high rates, namely by evaporation through the continuous spark current. It is known that excessively high coating rates reduce the diamond-like sp3 bonds of the carbon; this has been described in a paper by Yin et al., "A theory for the formation of tetrahedral amorphous carbon including deposition rate effects", in Thin Solid Films (1998), 95-100.

This results in the deposited layers becoming softer, which is not desirable, if these are to be used as protective coating against wear and tear. A possible solution consists in interrupting the coating after longer or shorter time intervals. This however means that it is necessary to re ignite again each time and that the advantages of the single ignition with the combination of the pulsed current with the continuous spark current are thus partly lost. The other disadvantage of this method resides in the proportion of the higher charged carbon ions is lower during continuous sparking.

The other method, method B, works with current pulses between which the spark current each time returns to zero. It is therefore necessary to reignite again each current pulse. There are many methods for achieving this ignition process. These have been described for example in a publication by Anders et al., "Triggerless' triggering of vacuum arcs", J. Phys D: Appl. Phys., 31 (1998), 584-587. All these methods have in common that they initially generate a plasma on the cathode or anode which then makes the path between these two electrodes sufficiently conductive for the spark discharge, which then takes place in a stationary state at low discharge voltage. The reliability of the ignition mechanisms varies. This also applies to the maximum pulse number that can be achieved with the specific ignition device before the latter needs to be overhauled. This means that comprehensive maintenance work needs to be performed. In the best cases, about 100,000 pulses are achieved without such a revision. This would mean that after 30 hours of operation time (at a pulse frequency of 1 Hz), such a revision would become necessary. If one were to work with higher frequencies, for example with a pulse frequency of 1 kHz. the process would have to be interrupted after barely 2 minutes. Higher frequencies would then be even less feasible with existing ignition mechanisms. Currently, frequencies over 10 Hz are hardly ever used, at least not for coating processes in production. The reason is that the repetition rate of the pulses is limited by the charging time of the capacitor. Usually, the duration (length) of the pulses in method B is in fact adjusted by the characteristic variables of a capacitor discharge or through the interruption of the pulse duration in the spark current supply.

In summary, it can be said that when compared to one another, methods A and B have both advantages as well as disadvantages. Method A requires only an initial ignition and currents even of very high frequency can then be superimposed over the continuous spark current. It can however be a disadvantage that the DC current portion determines a minimum evaporation rate that compromises the layer properties too much. The fact that the spark voltage in the pulse leads only temporarily to an overvoltage spike that is difficult to control and that is determined by the low impedance of the DC spark discharge also constitutes a disadvantage. This can possibly restrict the generation of multi-charged carbon ions.

The advantage of method B is the comparatively high voltage when igniting the spark (positive influence on the generation of multi-charged C-ions) and the possibility of adjusting the spark duration in such a manner that the spark (for example during ignition in the middle of the target) is interrupted before it reaches the target edge and jumps over onto other materials. The frequency of the pulses is limited mainly by the speed of the ignition mechanism. Most ignition methods, however, are unreliable and/or cause disproportionally high costs at high frequencies and over long process times, as already discussed above.

In view of the above, it would be desirable to have a method that operates with low or no DC current portion, yet at the same time has a high burning voltage in the pulse, with which it is additionally possible to work with high frequencies and wherein the pulse ignition is achieved reliably and efficiently.

The disadvantages of the different methods for igniting and operating a cathodic spark on a carbon target; can be summarized as follows: the methods so far for spark evaporation are based either on a DC spark current overlaid with pulses or on intermittent sparks operated with additional ignition devices. The pulse superimposition of method A merely results in small overvoltage spikes of the spark discharge in the pulse rise and the associated comparatively lower generation of multi-charged ions. The necessary charge time of the capacitor furthermore limits the duty cycle of the pulse portion. The frequent ignition during pure pulse operation in method B reduces either the reliability of the coating process and/or can be achieved only by means of very expensive solutions.

The aim of the invention is to propose a method for the cathodic spark evaporation of carbon, with which it is possible to achieve ignition sequences at very high frequencies and short pulse durations without the limitations of method A (permanent underlying direct current) and of method B (ignition at each pulse) being necessary.

Advantageously, it should be possible to combine this ignition method both with a "slow" initial ignition, as can be used with method A, and also with "fast" ignition methods of the discontinuous pulse operation that do not rely on a mechanical contact as described by Anders et al.

The invention should enable a discontinuous pulse operation without an additional ignition mechanism from another source being required after the initial ignition.

An essential aspect of the invention is the possibility of adjusting the value of the discharge current for the pulses, in order to specifically influence the degree of ionization of the carbon vapor.

Another aim of the invention is to propose a coating method for the production of carbon layers that enables a variable pulse-pause ratio during spark coating in order thus to achieve an optimum coating rate setting on the substrate.

The inventive method should additionally constitute an improvement of method A by providing, in combination with multiple pulses consisting of a fast sequence of individual pulses with short pulse times, a possibility for considerably increasing the discharge voltage of the spark discharge as compared with the discharge voltage of conventional direct current spark discharge.

The aim is attained in that during cathodic spark evaporation the spark discharge is achieved by means of the discharge of at least one capacitor and the corresponding discharge current is controlled in a usual manner by the periodic switching on and off of the capacitor, wherein according to the invention within the switched-on time intervals the discharge current is briefly interrupted when it reaches a predetermined value. This leads to further pulses occurring within the pulse, which will be referred to hereinafter as subpulses.

Surprisingly, to initiate the subpulses no direct current portion is required, i.e. within the pulse the spark discharge can be readily restarted after the voltage has been switched off. An ignition triggered externally is not required. Maintaining the spark by means of a direct current portion is also not required.

Even more surprising, however, is that due to the subpulses, after expiration of the pulse itself, after the capacitor has been switched off and at the end of the rest interval, switching on the capacitor will cause the spark discharge to start again, and this readily, i.e. without an ignition triggered externally being necessary. A base current between the pulses is therefore also not necessary. By contrast to the state of the art, the spark operation occurs according to the invention with considerable interruptions.

This has the advantage, on the one hand, that thanks to the subpulses within the switched-on time intervals, the ionization of the evaporated particles increases significantly. On the other hand, the possibility of reigniting the spark after the period of rest merely by switching on the discharge voltage has the advantage that the coating rate can be restricted without any problem and there is thus the possibility of achieving hard carbon layers with a high number of sp3.

There is as yet no complete explanation as to why the reigniting to subpulses as well as the renewed ignition after the rest interval is readily possible. The inventors however presume that the increased degree of ionization of the evaporated particles lowers the ignition threshold to such an extent that even a small voltage is sufficient for reigniting the spark. It is hypothesized that, possibly due to the inertia of the ionized particles, this applies in particular also after the end of the rest interval. It is important to note that the question as to how long the rest intervals between the pulses can be chosen depending on the pulse duration and the number of subpulses, will depend directly on the actual conditions of the spark evaporation facility used. It is however easy for the one skilled in the art to determine experimentally the duration of the rest interval at which the spark no longer ignites.

The invention will be described in detail on the basis of examples and with the aid of the figures, without this limiting in any way the general inventive idea.

The figures show:

FIG. 1: diagrammatic representation of method A (state of the art)

Figure 2:
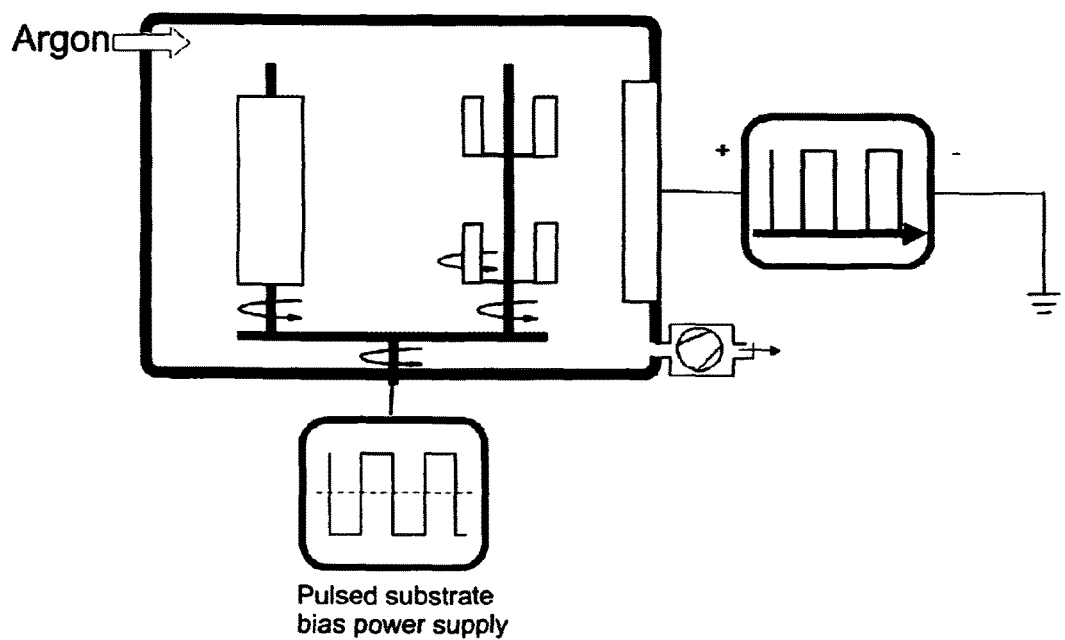

FIG. 2: diagrammatic representation of method B (state of the art)

Figure 3:
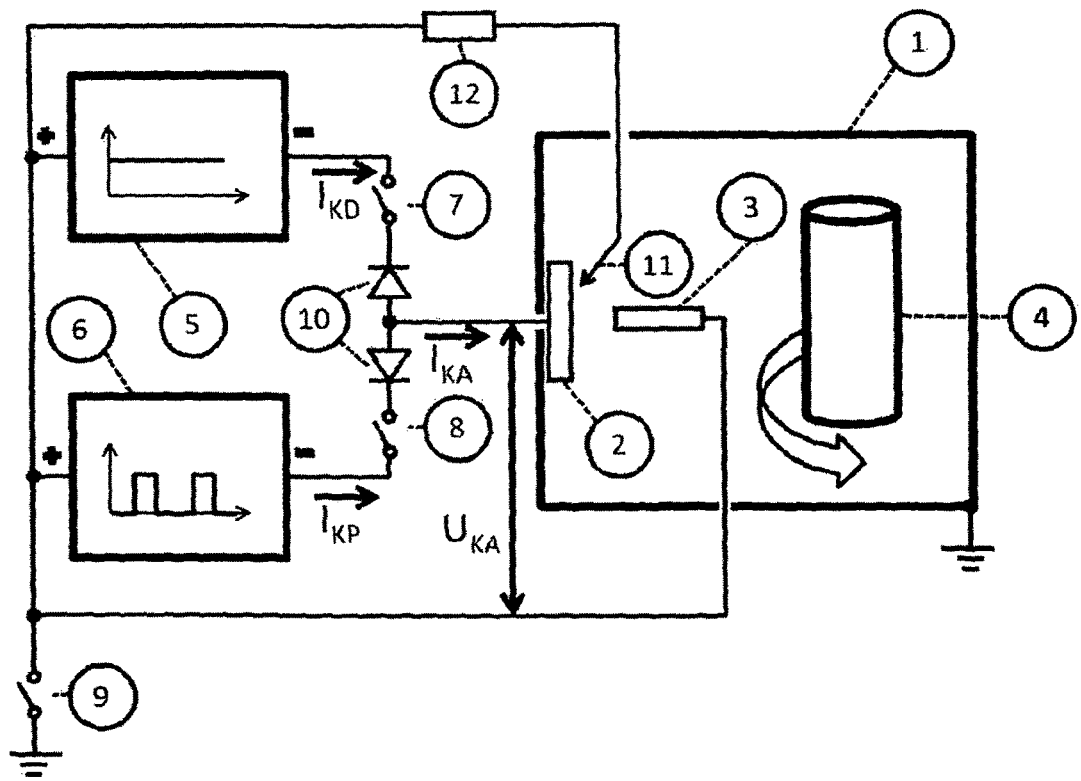

FIG. 3: vacuum coating facility and circuitry with electric supplies

Figure 4:
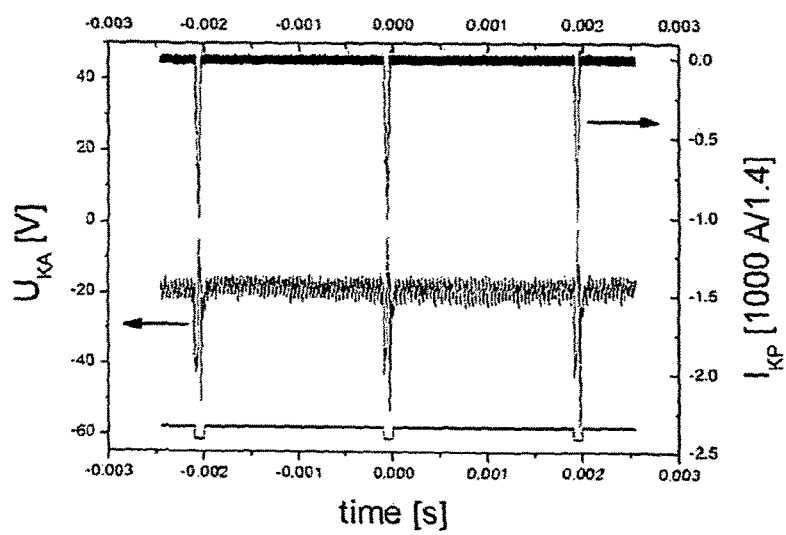

FIG. 4: temporal progression of $U_{KA}$ and $I_{KP}$ when operating the spark discharge as per method A according to the state of the art with a pulse frequency of 500 Hz. A time of 100 µs was specified as pulse length.

Figure 5:
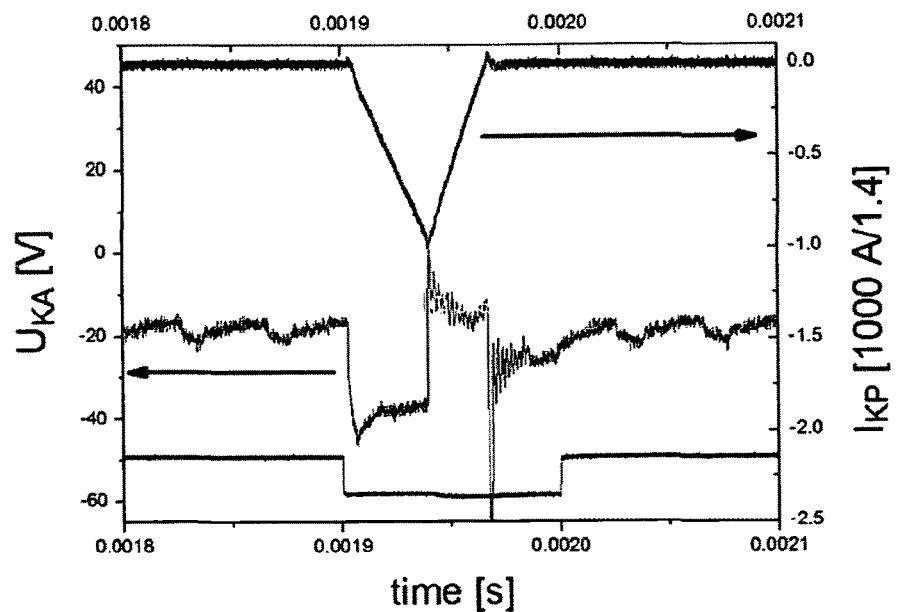

FIG. 5: temporal progression of $U_{KA}$ and $I_{KP}$ for a individual pulse with better resolution when operating the spark discharge as per method A according to the state of the art with a pulse frequency of 500 Hz. The trigger signal for the pulse is 100 µs. The current increase takes place during the predetermined pulse time, wherein the current reaches the freely selectable current limitation of approx. 720 A already before 100 µs, which results in the voltage being switched off after approx. 40 µs.

Figure 6:
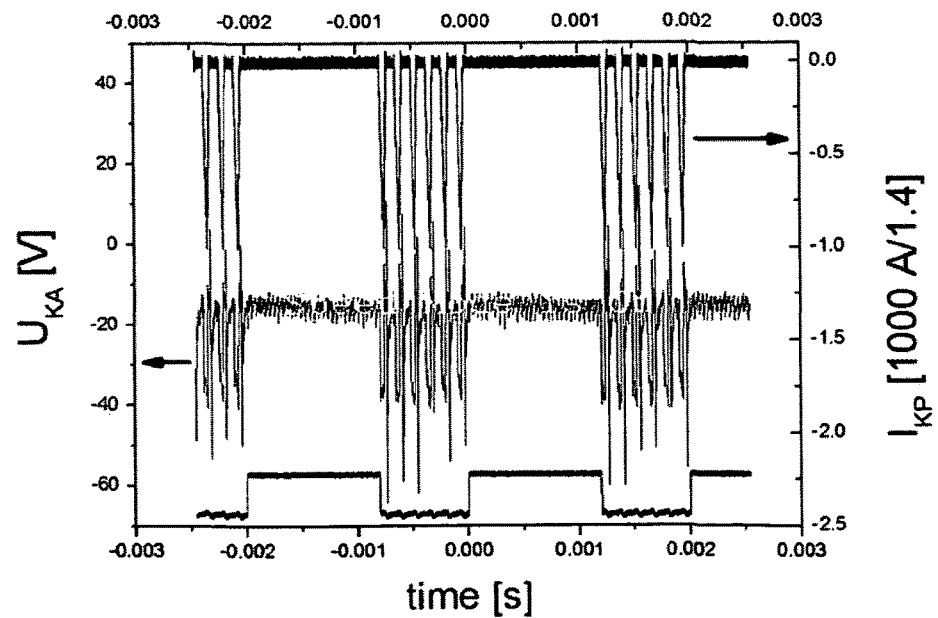

FIG. 6: representation of an operation with pulsed spark discharge (improved method A). The direct current supply (5) supplies an $I_{KD}$ of 30 A (not shown). Pulses with the pulse current supply (8) were superimposed over this direct current discharge. The pulse current $I_{KP}$ is represented in the figure. The pulse length was set in this case at 800 µs (trigger signal indicated). Between the pulses, a pulse pause was set at 1200 µs. The current was switched off respectively at approx. 700 A. In these conditions, it is possible to observe the formation of a cluster of pulses over the length of the specified pulse, which is composed respectively of 6 subpulses.

Figure 7:
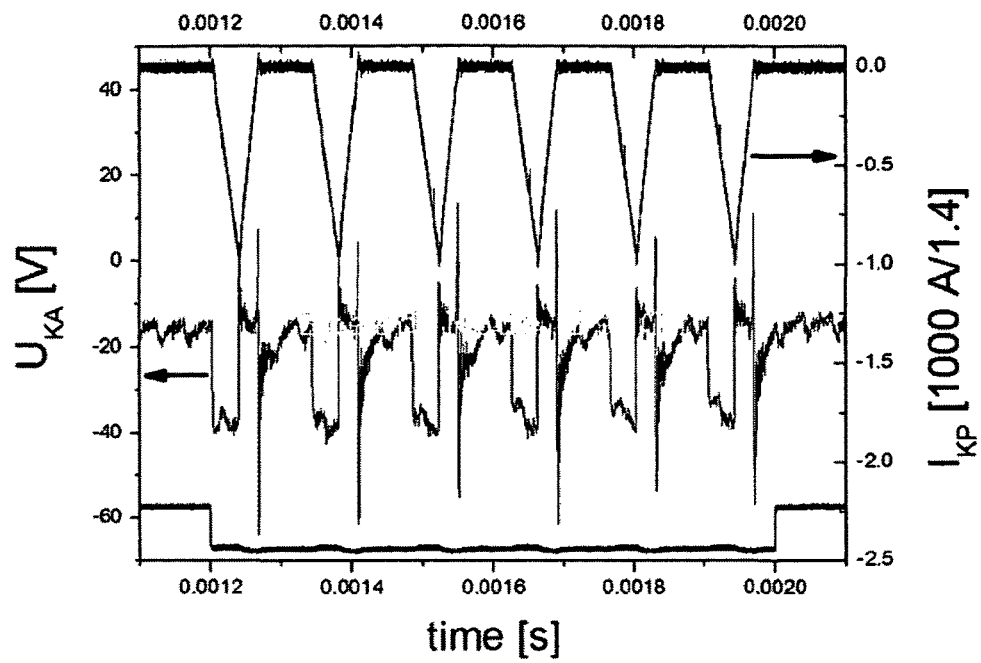

FIG. 7: improved temporal resolution of the curves of FIG. 6. The specified pulse length is 800 µs with a current limitation at approx. 700 A. In this pulse length, 6 subpulses are generated by the current limitation, wherein in each subpulse the voltage above approx. 40 µs is stabilized at a higher level.

Figure 8:
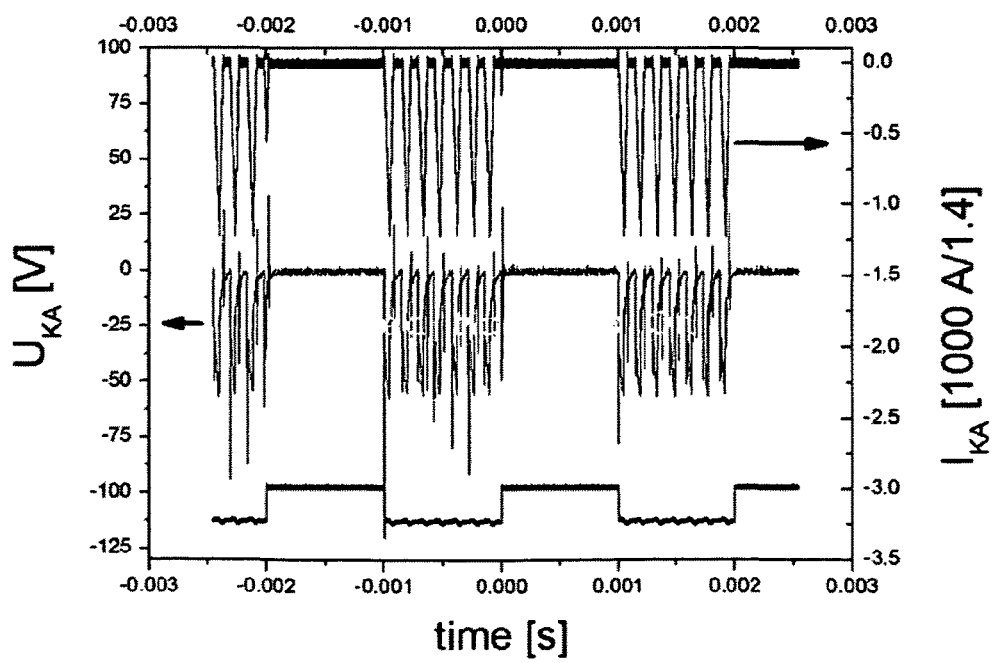

FIG. 8: inventive operation of the pulsed spark discharge. The FIG. shows the temporal progression of $I_{KP}$ and $U_{KA}$ for the case of the switched off direct current supply (5) (according to an operation with merely discontinuous pulses). The specification was for pulse lengths of 1000 µs and pulse pauses also of 1000 µs.

Figure 9:
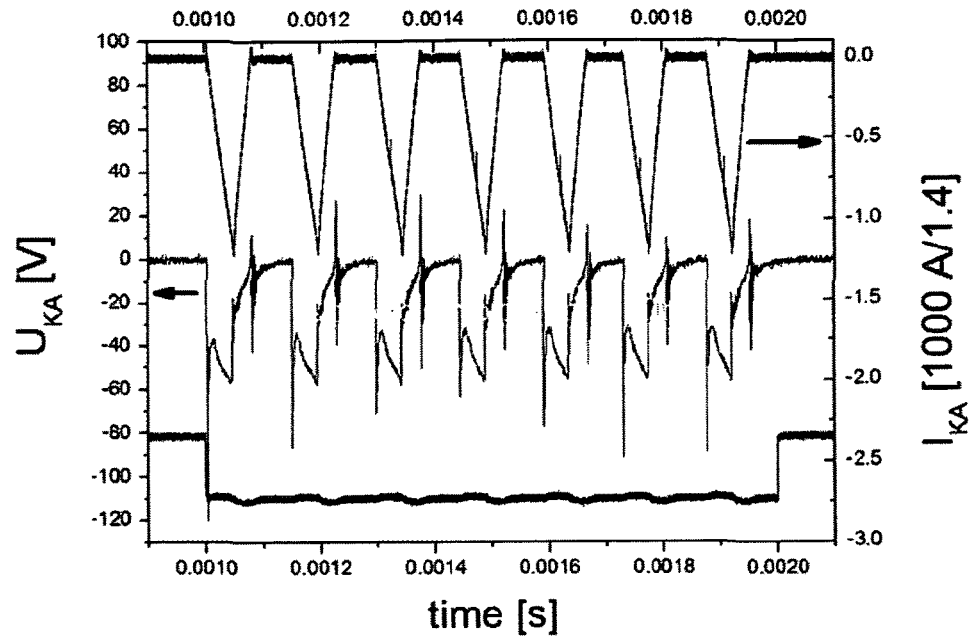

FIG. 9: improved temporal resolution of FIG. 8. A single pulse with 7 subpulses is shown. The curve shows that ignition voltages around 60V are sufficient to reignite the subpulses within the single pulses without additional ignition devices being required. Surprisingly, these voltages are also sufficient for reigniting the individual pulses after 1000 µs.

Figure 10:
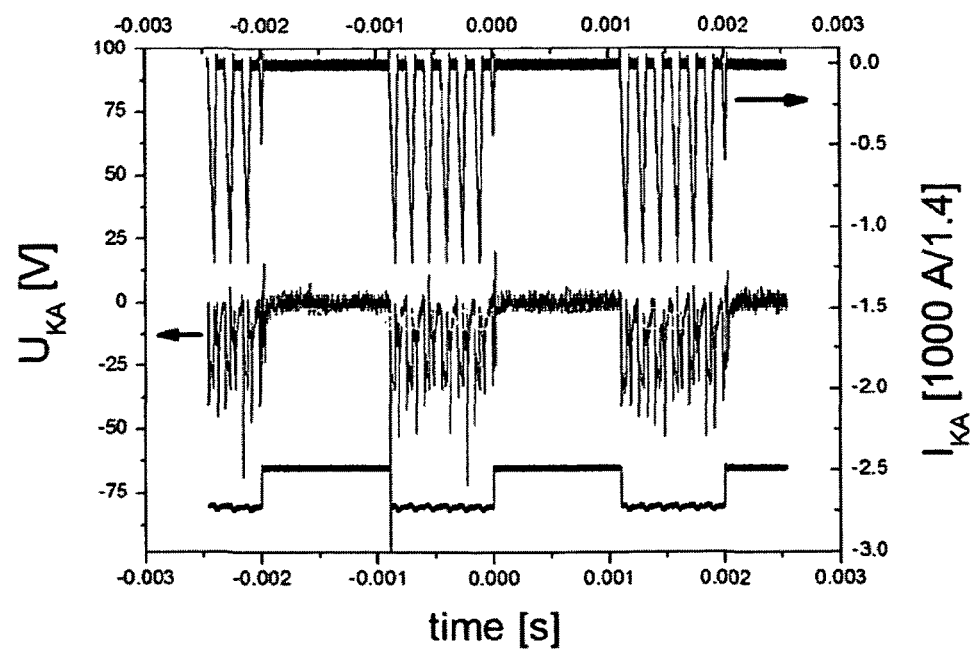

FIG. 10: The FIG. shows the temporal progression for $U_{KA}$ and $I_{KP}$ (according to the invention without being superimposed over direct current) for a predetermined pulse duration of 900 µs, in the course of which 6 subpulses are generated. A time of 1100 µs was chosen as pulse pause. For this case, the ignition operation could only just be achieved with the purely discontinuous pulses. For smaller pulse lengths and longer pulse pauses in this experimental configuration, the ignition could no longer be ensured.

In FIGS. 4 to 6, 3 curves are respectively represented. The uppermost curve corresponds to the current pattern. Accordingly, the right axis is relevant. The middle curve corresponds to the voltage pattern. Accordingly, the left axis is relevant. The lowest curve should merely show the pulse duration. Its amplitude is chosen in random units.

The tests were performed on a vacuum coating facility of the type Innova of the company OC Oerlikon Balzers AG. The description will make the transferability of the method to other vacuum coating facilities apparent to the one skilled in the art.

The vacuum coating facility is represented diagrammatically in FIG. 3 and includes a receptacle 1 that can be evacuated, in which is located a rotatable substrate holder 4 for receiving the substrates to be coated. In all tests, argon gas was admitted at a flow of 200 sccm into the evacuated receptacle, with a total pressure in the receptacle of 0.6 Pa being reached. The pressure range of the argon gas can be varied to a large extent and other gases, for example nitrogen, can also be used.

A spark evaporation source containing the carbon target 2 to be evaporated is furthermore located in this evacuable receptacle. The target 2 is mounted accordingly, being held mechanically and being insulated from the receptacle 1 which is connected to ground. It is switched as cathode for the spark discharge. Additionally, an anode 3 is located in the receptacle and is mounted preferably in the vicinity of the target 2 operated as cathode. The spatial proximity of the anode 3 to the target 2 makes the spark operation easier, especially the ignition process in the case of the discontinuous pulse sequences with "self ignition" or without additional external ignition. The central arrangement of the anode 3 also contributes to the stability of the spark, because it encourages the ignition process especially in the target center and prevents the spark from running to the target edge. The pulsing of the spark current also contributes to stabilizing the spark discharge. First, because it prevents the spark from persistently remaining on one spot of the target but also, and this applies especially in the case of discontinuous spark operation, because, helped by the central placing of the anode 3 relative to the target 2, it encourages the spark ignition in the middle of the target and the spark current can be interrupted (by setting the pulse length) before the spark can reach the target edge. Two electric supplies are used for the cathodic spark evaporation of the target 2, whose functions can of course be fulfilled also within one feed. The direct current supply 5 represents a current supply with an open-circuit voltage of typically 100V. In spark operation, due to the low impedance of the spark discharge (less than 1 Ohm), this voltage will settle to voltages below 50V, in the case of a carbon target typically to voltages around 20V. In the case of such current supplies, typical currents up to approx, 1000 A can be set. In the experiments described here, however, only the current range around 100 A and lower is preferably used since coating rates that are too high, as mentioned above, will indeed reduce the hardness of the carbon layers. The pulsed electric supply 6, which essentially switches a capacitor discharge, is designed with its electronic component elements in such a manner that it can switch high discharge currents. It can therefore make sense to size the electronic component elements (e.g. IGBT) in such a manner that an optimum can be sought between the required discharge current and the switching frequency. The size of the capacitor is chosen so that for a given charging voltage on the capacitor, sufficient energy (q=CU) can be stored in order to feed the cathodic spark or, in other words, to evaporate the corresponding cathode material (here carbon). The design of the pulsed electric supply is thus a compromise between pulse current, pulse frequency, charging voltage and available capacitor capacity. The switches 7 and 8 enable the electric supplies for operating the spark discharge to be connected to the target.

It is also possible, and this is new and part of the invention, to operate the spark discharge after an initial ignition fed alone through the pulsed electric supply, namely only with the pulsed current $I_{KP}$. The entire spark current $I_{KA}$ is then identical with $I_{KP}$. The discharge voltage of the spark discharge $U_{KA}$ is measured between the cathode (target 2) and the anode 3, as represented in FIG. 3. If the spark discharge were to be operated alone with the pulsed supply, it would be required in the state of the art to reignite again and again at each pulse. With the inventive method, this continuously renewed ignition is unnecessary.

The supplies are each fused with diodes 10 which prevent the supplied current from being fed from one supply into the other and thus damages from occurring. Usually, the positive outputs of the supplies are connected to earth, i.e. to the potential on which the receptacle is also placed. It can however also be advantageous to operate the spark discharge floatingly (with zero potential). For this purpose, the switch 9 is opened. Depending on the switch position, the anode is thus operated either with zero potential or on mass potential (same potential as the receptacle). In the tests, for the initial ignition of the spark discharge a mechanical ignition contact 11 was used which momentarily establishes via a low-ohmic resistance a contact with the anode and thus results in an initial evaporation of the target material, which then renders conductive the path from the cathode to the anode so that the electric supplies 5 and/or 6 take over the spark feed for evaporating the target material, i.e. they are operated at lower voltages. After the initial ignition, according to the invention the electric direct voltage supply 5 is switched off for example via the switch 7. The spark is henceforth fed exclusively by the pulsed electric supply 8 without direct current portion.

It has been shown in the literature for discontinuous pulse operation (method 8) that an excessive increase of the current at the beginning of the pulse contributes to the increase of the proportion of multi-charged ionized ions of the evaporated target material (Paperny et al., "Ion acceleration at different stages of a pulsed vacuum arc", J. Phys. D: Appl. Phys. 42 (2009) 155201). Unfortunately, the voltage characteristic was not examined during these tests. The excessive increase of the current at the beginning of the pulse is probably caused by the momentary application of a higher voltage, i.e. the excessive increase in the voltage is possibly to be considered the cause itself for the increased ionization and the current increase represents merely a secondary effect.

In method B, an increased spark voltage can be achieved in that the spark is ignited under the condition that a high open-circuit voltage is applied between cathode and anode. This can occur for example in that the capacitor that is used for the discharge in the pulse is charged to a high voltage and the spark is ignited based on this high open-circuit voltage of the capacitor through a further momentary evaporation of material. After ignition, the capacitor then discharges as long as its charge lasts in order to maintain the spark. Immediately after the ignition (typically within the first 50 µs), the spark discharge occurs at increased voltage and subsequently falls back again to a lower voltage value which is typically given by the impedance of the respective direct current spark discharge.

According to the present state of knowledge (Paperny et al.), the generation of the ions having higher charge states occurs at the beginning of the current pulse and is then lost after the latter, so that for a pulse length of 200 µs, after the first 50 µs, only charge states are generated that are typical for direct current spark discharge. Therefore, in order to generate higher charge states, it is important to generate short current pulses in the order of magnitude below 10 µs, preferably below 50 µs. At typical pulse frequencies of 1 kHz, this would mean a significant reduction of the duty cycle and result in very low coating rates. A faster external ignition through material evaporation is coupled to the charging behavior of the capacitor to be used (the capacity of the capacitor must be sufficient great to generate material plasma to ignite) and in good cases is achieved also at 1 ms charge time (see Anders et al.), i.e. at approx. the frequency of 1 kHz. It would be conceivable as a possibility, albeit an expensive one, to couple several ignition capacitors temporally to one another in order to obtain pulse sequences with higher frequencies. This is however laborious and expensive and has so far, to the inventors' knowledge, also not been pursued to date. The increase of the pulse frequency, especially for short pulses and in discontinuous operation, is a further aspect that is solved by the invention.

Whilst a current increase at the beginning of the pulse in method B it is thus comparatively easy to achieve and can be complex merely because of the high voltage at the ignition mechanism, high spark voltages are more difficult to achieve with method A. The one skilled in the art knows that a gradual voltage increase in the direct current spark discharge results in a "limitless" current increase without a noticeable overvoltage occurring. It is only the superimposition of the direct current with very steep pulses that increases the voltage of the spark discharge in method A. It is difficult to stabilize this voltage increase over longer periods of time, since the current rises quickly and the capacitor discharges quickly, with the breakdown associated therewith of the voltage at the capacitor. This applies in particular for the case of the underlying direct current, since a direct current spark discharge has small impedances in the range of only approx. 0.1 Ohm.

The inventive methods are also based on a further aspect of the cathodic spark evaporation of carbon. From the investigations of Horikoshi at al., "Vacuum Arc Deposition of Homogeneous Amorphous Carbon Films at High Growth Rates", New Diamond and Frontier Carbon Technology, Vol. 18, No. 5 (2006), 267-277, it is possible to conclude that the discharge voltage at the capacitor and the size of the charge during the capacitor discharge influence the frequency of splatters during cathodic spark evaporation, in the sense that the higher the discharge voltage is and the greater the charge quantity during discharge is, the smaller the number of splatters is. This was shown for individual current pulses according to method B. The pulse shapes recorded in that connection (FIG. 4 in Horikoshi et al.) represent the typical current-time progression for a capacitor discharge: at the beginning a steep current rise up to a maximum, that is typically reached within the first 100 µs, and then slower current drop. The pulse length depends on the capacity and the impedance of the discharge. Discharge voltage and charge also influence the pulse shape.

The experiments described here were carried out with a pulsed electric supply 6 based on a controlled capacitor discharge and which in this special case allowed pulse frequencies up to 2 kHz at maximum discharge currents of 1000 A. The capacitor had a capacity of 8 mF and voltages up to 1000V could be used for charging the capacitor.

The amplification of the capacitor readily makes it possible to also use currents of 2000 A or more and charging voltages of up to 2000V can also be used. The charging time of the capacitor is proportional to the product of R and C, wherein R is the ohmic resistance in the load circuit and C is the capacity of the capacitor. If one thus wishes to charge capacitors with large capacities C, one is forced either to take into account long charging times or to use high charging voltages in order to achieve the same charge quantity of the capacitor with shorter charging times. Higher charging voltages reach the acceptable limits of the electronic component elements and longer charging times limit the pulse frequency (Anders et al.). The use of higher charging voltages is also further limited by the current limitation of the direct current supply that is used for charging the capacitor (the latter is either integrated in the supply 6 or is connected to 6 as an external supply and is not represented separately in the figure). All these facts have so far prevented cathodic spark discharges at increased spark voltages over longer pulse times and at higher frequencies to be performed for the purpose of material evaporation, especially for the purpose of the evaporation of carbon.

First, a method is to be described that results in an improvement of method A. In this method already described in the document EP:00888335_A1 by Grimm, a direct current spark discharge is ignited via a momentary contact of the mechanical ignition finger (anode) with the target, which is then further maintained via the supply 5. Additionally, current pulses from a capacitor discharge (supply 6) are superimposed over this direct current discharge. The temporal current pattern of these pulses does not differ essentially from those that have also been indicated in Horikoshi et al.: increase of the current pulses at the beginning and then drop caused by the discharge of the capacitor and depending on the respective impedance. With an underlying direct current, the latter is on the order of magnitude of 0.1 Ohm, i.e. the capacitor is quickly discharged (time constant R×C).

The temporal progression of the voltage $U_{KA}$ and of the current $I_{KP}$ for such an operation is represented in FIG. 4. The current $I_{KD}$ (not represented) was pre-specified at 30 A with supply 5. Usually, this current collapses during the pulse from supply 6 since the diode then blocks the $I_{KD}$ current. Pulses with a frequency of 500 Hz were generated and a pulse length of 100 µs and a pause between the pulses of 1900 µs were specified. During the pulse progression, there is an excess increase in both voltage as well as current, which with an improved time resolution is clearer in FIG. 5 which illustrates a pulse specified at 100 µs. Consequently, the voltage at the begin of the pulse changes from −20V, i.e. the voltage set in the direct current case with the electric supply (5), to approx. −50V and it then stabilizes at around −40V. The result of this voltage increase in absolute value is a strong current increase. If one were now to proceed according to the previous operation mode for method A (document EP_00666335_A1 of Grimm) and allow the capacitor to freely discharge, the current would increase further, the capacitor would quickly discharge and the voltage would fall with the current increase (charge drain from the capacitor). The voltage would thus vary widely in time.

In order to stabilize higher discharge currents, the magnitude of the spark current is thus limited, even before the voltage at the capacitor has been reduced too much. This is explained on the basis of FIG. 5. At the supply 6, a pulse length can be prescribed that limits the discharge time and for which in this case 100 µs were chosen. For the sake of a better comprehension, the trigger signal for the pulse has also been illustrated in FIG. 5 (lowest curve). For the pulse current, an upper threshold of 720 A was set (in the figure, 1.4V correspond to approx. 1000 A). The current was limited in such a way that the voltage of the spark discharge could be maintained stable in time within certain limits or, in other words: the current was switched off at a current value for which the voltage had not yet collapsed to any substantial degree. This depends on the respective experimental conditions (such as for example also the cable inductivities) and on the technical data of the supply 6 used and on the properties of the direct current spark discharge. This current limitation can however easily be determined experimentally by means of an oscilloscope showing the temporal current and voltage patterns.

FIG. 5 shows in particular that the current (uppermost curve in FIG. 5) has reached this threshold value already before the pulse duration of 100 µs had been reached and that it is possible with this method of switching off of the current earlier before the voltage collapse to stabilize the higher voltage $U_{KA}$ over approx. 40 µs, i.e. in the range in which the higher charging states of the cathode material are generated.

It has been shown that the excessive voltage increase depends on the charging voltage of the capacitor (300V were used here) but also on the size of the capacitor that has to be charged (here 8 mF). By using in this experiment a direct voltage supply for charging the capacitor in which the maximum current was limited to 30 A and operation was with a pulse frequency of 500 Hz, the capacity between the pulses cannot be fully charged again. This is only mentioned because it has to be shown that the method also works with such limitations.

FIG. 6 now illustrates an operation with pulsed spark discharge. In this case, the direct current supply 5 used again supplies an $I_{KD}$ of 30 A. Pulses with the pulse current supply 6 are then superimposed over this direct current discharge. The pulse current $I_{KP}$ is represented in FIG. 6. The pulse length in this case was specified at 800 µs (trigger signal indicated). Between the pulses, a pulse pause of 1200 µs was set. For switching off the current, the maximum current was again limited to approx. 700 A. Under these conditions, it is possible to observe the apparition of a cluster of pulses over the length of the specified pulse, which is composed each of 8 subpulses. By way of explanation, a better temporal resolution was chosen in FIG. 7. It shows that, if working again with the current limitation, the generation of the subpulses can determine the discharge voltage in a similar manner as for the conditions in FIG. 5 to values of approx. −40V, again over approx. 40 µs, i.e. for the duration of a subpulse. The time constant for the renewed switching on of the subpulses is approx. 100 µs. This is caused by the commutation behavior of the protection diodes and can be shorted by faster diodes. In FIG. 7 it is also possible to see that in a predetermined pulse of 800 µs and a current limitation at 700 A, 6 subpulses can be generated with a sequence of the subpulses that is greater than that possible from the original supply (here greater by a factor of about 7.5). Simultaneously, in the pulse with a length of 800 µs, generating 6 subpulses will allow the voltage to be stabilized over a time of 6×40 µs, i.e. overall for 240 µs.

For method A, it is thus possible with this method to both increase the pulse frequency as well as stabilize the spark discharge at a higher voltage. However, even more important is the possibility with this method of specifying to a large extent the ratio of direct current portion to pulse current portion in favor of the pulse current portion. In FIG. 4, an $I_{KD}$ of 30 A is used and a temporal mean of $I_{KP}$ of 12 A. By contrast, in FIG. 6 a temporally averaged $I_{KP}$ of 70 A is used for the same ratio of direct current.

It would now be desirable to generate a cluster of subpulses in method B. The direct current portion could thus completely avoided. In this method, which is based on discontinuous pulses, one is confronted with the problem of ignition at each pulse but even more with the problem of the ignition of individual subpulses that has to take place at the much higher sequence. This problem cannot be solved with the present state of the art ignition mechanisms.

It has therefore been tested whether the combination of spark current limitation, increased discharge voltage and higher sequence of the subpulses thus generated can generate sufficient conductive plasma and for sufficiently long for an external ignition to be discarded, except merely for a single initial ignition via 5 in connection with the mechanical ignition finger 11.

For this purpose, the following procedure was followed. In a first step, the direct current spark discharge with a current $I_{KD}$ of 40 A was ignited by the momentary contact between the ignition finger 11 and the target 2. Then, in a similar manner to method A, the pulsed supply was switched on and a pulse current $I_{KP}$ was superimposed to the direct current. As a further step, the direct current supply 5 was switched off. In FIG. 8, the temporal progression of $I_{KP}$ and $U_{KA}$ is now represented for the case of the switched-off direct current supply 5 (according to an operation with merely discontinuous pulses). Pulse lengths of 1000 μs and pulse pauses of also 1000 μs were specified. Surprisingly, it was possible with such a mode of operation to ensure that no renewed ignition between the subpulses within the cluster of pulses and, even more surprisingly, also between the individual pulses was required. FIG. 9, which illustrates with a better temporal resolution an individual pulse with 7 subpulses, shows that ignition voltages with a value around 60V are sufficient for igniting again the subpulses within the individual pulse, without additional ignition devices being necessary. Surprisingly, these voltages are also sufficient for reigniting the individual pulses after 1000 μs. The method thus provides a way with which a discontinuous pulse operation can be achieved without additional ignition device. Furthermore, the sequence of the subpulses within the individual pulse can be increased, in the present case to approx. 7 kHz.

The reason why this quick and easy method for igniting sparks works has not been fully explained. It is presumed that the mixture of argon gas and evaporated carbon in connection with the intensive ionization via the pulsed operation (high electron streams) are sufficient for forming a highly conductive plasma sufficiently long, in which the spark discharge can be ignited again at low voltages. In order to estimate the limit for the only just achievable ignition for the device used in these experiments and the special process parameters, the individual pulse was made shorter and the pulse pause longer. In FIG. 10, a pulse with a duration of 900 μs is represented, during the course of which 6 subpulses are generated. A time of 1100 μs was chosen as pulse pause. For this case, the ignition operation with the purely discontinuous pulses was just barely achievable. For smaller pulse lengths and longer pulse pauses, the ignition could no longer be safely guaranteed. It is however obvious to the one skilled in the art that modified capacities, other current switch-off levels, different (or no) gas flows, other voltages on the capacitor etc. will influence these thresholds of self ignition and can easily be set for the respective experimental arrangements.

The inventive method was described for the cathodic spark evaporation of carbon because it is particularly difficult with this material to operate the cathodic spark, i.e. to prevent the "seizing up" on one target position. The method can however be used advantageously also for other materials. These can be elemental metallic targets but also targets consisting of several materials such as for example powder-metallurgically produced targets. The method is particularly advantageous for materials with a low melting point, because in this case too the pulsed operation reduces the formation of splatters. This method can also be used advantageously in reactive processes in gases that contain oxygen, nitrogen or carbon to increase the ionization and reduce the formation of splatters.

By having the anode arranged centrally with respect to the target and by using a pulsed spark current, especially in discontinuous operation, it is possible to ensure a stable spark discharge.

The discontinuous pulsed operation also enables the cathodic evaporation of carbon targets with metallic parts up to 50% at.

The method of distributing the individual pulses over clusters of subpulses of higher sequence and over longer times enables a discontinuous pulsed operation without additional external ignition, between the subpulses lying closer to one another as well as between the individual pulses.

The voltage at the capacitor (supply 6) can be changed to a large extent for the purpose of generating higher charged ions of the material evaporated in the cathodic spark discharge.

The higher discharge voltage in combination with a fast but current-limited discharge reduces the incidence of splatters in the synthesized carbon layers or layers containing carbon.

The method represents a discontinuous pulse operation of a spark discharge, without having to be re ignited.

On the basis of the method, no DC maintenance current is required for the spark discharge.

In the frame of this description, a method has been disclosed for operating a pulsed discontinuous spark discharge that is achieved by means of the discharge of at least one capacitor and where the corresponding discharge current is controlled by periodical switching on and off of the capacitor, wherein when the capacitor is switched off during the switched-off time intervals, no current is supplied from the supply, and within the switched-on time intervals the discharge current is momentarily interrupted upon reaching a previously determined threshold, with the result that subpulses occur within the pulses.

Preferably, a first plurality of the switched-off time intervals is chosen so short that after their respective expiration, the switching on of the capacitor readily causes the renewed ignition of the spark discharge.

The first ignition of the spark discharge is preferably achieved by means of an ignition device, even more preferred by means of a DC direct voltage source, and after ignition of the spark the capacitor is switched on for the first time. The capacitor preferably has at the time of the first ignition by means of charging means a first charge state and the spark discharge is subsequently further operated with the DC direct voltage source switched off.

There can be a second plurality of switched-off time intervals depending on the charging means of the at least one capacitor that are chosen so long that the capacitor after expiration of the second plurality of switched-off time intervals has essentially reached the first charge state.

The spark discharge described above can be used for operating a cathodic spark evaporation.

A method for coating substrates has been described that comprises the following steps:

providing substrates placing the substrates in a vacuum chamber
pumping out the vacuum chamber
performing a cathodic spark evaporation of the kind described above.

By means of this coating method, it is possible to produce carbon layers that are hydrogen-free and/or contain hydrogen and/or metal-free and/or contain metal.

LIST OF REFERENCES 1 receptacle
2 target (cathode)
3 anode (preferably but not necessarily centered relative to the target)
4 substrate holder (rotating)
5 direct current (spark) supply
6 pulse current (spark) supply
7 switch for switching $I_{KD}$
8 switch for switching $I_{KP}$
9 switch for switching the anode to earth or to floating potential
10 protection diodes
11 mechanical ignition finger
12 resistance for current limitation between ignition finger and anode

The invention claimed is:

1. Method for depositing a layer on a substrate, comprising the steps of:
providing substrates;
placing the substrates in a vacuum chamber;
pumping out the vacuum chamber;
providing two separate current supplies, namely a direct current supply and a pulse current supply that discharge to achieve a pulsed discontinuous spark discharge,
with the pulse current supply comprising at least one capacitor and where the corresponding discharge current of the pulse current supply is controlled by periodical switching on and off of the capacitor to form switched-on time intervals and switched-off time intervals,
wherein the capacitor is switched off during the switched-off time intervals, during which no current is supplied from the direct current supply and no current is supplied from the pulse current supply,
wherein within the switched-on time intervals, no current is supplied from the direct current supply and the discharge current of the pulse current supply is momentarily interrupted upon reaching a previously determined threshold, with the result that subpulses occur within a current pulse from the pulse current supply; and
depositing the layer on the substrate by performing a cathodic spark evaporation by means of the pulsed discontinuous spark discharge,
wherein the layer comprises carbon.

2. Method according to claim 1, wherein at least a first plurality of the switched-off time intervals is chosen so to be short enough that after expiration of each one of the plurality of the switched-off time intervals, the switching on of the capacitor automatically causes the renewed ignition of the spark discharge.

3. Method according to claim 1, wherein the first ignition of the spark discharge is achieved by means of an ignition device, and after the first ignition of the spark the capacitor is switched on for the first time and has a first charge state at the time of the first ignition,
and the pulsed discontinuous spark discharge method is subsequently further operated with the direct current supply switched off.

4. Method according to claim 3, wherein a length of a second plurality of switched-off time intervals is chosen depending on the charging means of the at least one capacitor, such that after expiration of each of the second plurality of switched-off time intervals, the capacitor has essentially reached the first charge state.

5. Method according to claim 1, wherein the layer is one or more carbon layers that are hydrogen-free and/or contain hydrogen and/or metal-free and/or contain metal and is coated on the substrate.

6. Method for depositing a layer on a substrate, comprising the steps of:
providing substrates;
placing the substrates in a vacuum chamber;
pumping out the vacuum chamber;
providing two separate current supplies, namely a direct current supply and a pulse current supply that discharge to achieve the pulsed discontinuous spark discharge,
with the pulse current supply comprising only one discharging capacitor and where the corresponding discharge current of the pulse current supply is controlled by periodical switching on and off of the capacitor to form switched-on time intervals and switched-off time intervals,
wherein the capacitor is switched off during the switched-off time intervals, during which no current is supplied from the direct current supply and no current is supplied from the pulse current supply,
wherein within the switched-on time intervals, no current is supplied from the direct current supply and the discharge current of the pulse current supply is momentarily interrupted upon reaching a previously determined threshold, with the result that subpulses occur within the a current pulse from the pulse current supply; and
depositing the layer on the substrate by performing a cathodic spark evaporation by means of the pulsed discontinuous spark discharge,
wherein the layer comprises carbon.

7. Method according to claim 3, wherein the ignition device that causes the first ignition of the spark discharge is a DC direct voltage source.

8. Method according to claim 1, wherein the direct current supply provides current for the first ignition of the spark discharge during a first switched-on time interval.

9. Method according to claim 8, wherein during switched-on time intervals after the first switched-on time interval, no current is supplied from the direct current supply.

10. Method according to claim 1, wherein the switched-on time intervals and switched-off time intervals alternate with each other.

* * * * *